(12) United States Patent
Shirai et al.

(10) Patent No.: US 9,278,617 B2
(45) Date of Patent: Mar. 8, 2016

(54) SOLAR BATTERY MOUNTING STRUCTURE FOR VEHICLE

(71) Applicant: TOYOTA JIDOSHA KABUSHIKI KAISHA, Toyota-shi, Aichi-ken (JP)

(72) Inventors: Yasuhiro Shirai, Toyota (JP); Kazutaka Kimura, Susono (JP); Yuki Kudo, Susono (JP)

(73) Assignee: TOYOTA JIDOSHA KABUSHIKI KAISHA, Toyota-Shi (JP)

( * ) Notice: Subject to any disclaimer, the term of this patent is extended or adjusted under 35 U.S.C. 154(b) by 0 days.

(21) Appl. No.: 14/530,992

(22) Filed: Nov. 3, 2014

(65) Prior Publication Data
US 2015/0129325 A1    May 14, 2015

(30) Foreign Application Priority Data

Nov. 8, 2013  (JP) ................. 2013-232483

(51) Int. Cl.
| | |
|---|---|
| *B60K 16/00* | (2006.01) |
| *B60L 8/00* | (2006.01) |
| *H01L 31/048* | (2014.01) |
| *H02S 20/20* | (2014.01) |

(52) U.S. Cl.
CPC .............. *B60K 16/00* (2013.01); *B60L 8/003* (2013.01); *H01L 31/048* (2013.01); *H02S 20/20* (2014.12); *B60K 2016/003* (2013.01)

(58) Field of Classification Search
CPC .. B60K 16/00; B60K 2016/003; B60L 8/003; H02S 20/00; H01L 31/042; H01L 31/048

USPC .................................................. 136/251, 259
See application file for complete search history.

(56) References Cited

U.S. PATENT DOCUMENTS

| | | | | |
|---|---|---|---|---|
| 5,578,142 | A | * 11/1996 | Hattori et al. | ................. 136/251 |
| 6,155,635 | A | 12/2000 | Wecker | |
| 6,172,295 | B1 * | 1/2001 | Hattori et al. | ................. 136/251 |
| 6,283,542 | B1 * | 9/2001 | Pâtz | ............................. 296/211 |
| 6,586,668 | B2 * | 7/2003 | Shugar et al. | ................. 136/244 |
| 6,662,572 | B1 * | 12/2003 | Howard | ......................... 62/3.61 |

(Continued)

FOREIGN PATENT DOCUMENTS

| | | | |
|---|---|---|---|
| CN | 102646737 | A * | 8/2012 |
| JP | 62-085743 | A | 4/1987 |

(Continued)

*Primary Examiner* — Paul N Dickson
*Assistant Examiner* — Steve Clemmons
(74) *Attorney, Agent, or Firm* — Kenyon & Kenyon LLP

(57) ABSTRACT

A solar battery mounting structure for a vehicle mounts a solar battery module on the roof of a vehicle body. The solar battery module includes a glass panel and sealant located on a side of the glass panel that faces the inside of the passenger compartment of the vehicle. Solar battery cells are sealed in the sealant. A roof reinforcing member bridges over the roof of the vehicle body. The solar battery module includes a through portion that extends to the glass panel through the sealant. Adhesive is provided in the through portion. The adhesive bonds and fixes the glass panel to the roof reinforcing member.

1 Claim, 11 Drawing Sheets

(56) References Cited

U.S. PATENT DOCUMENTS

| | | | |
|---|---|---|---|
| 6,675,580 B2 * | 1/2004 | Ansley et al. | 60/641.8 |
| 8,182,025 B2 * | 5/2012 | Auchter-Bruening | 296/191 |
| 8,834,664 B2 * | 9/2014 | Brecht et al. | 156/251 |
| 9,021,752 B2 * | 5/2015 | Schumacher | 52/173.3 |
| 2007/0131272 A1 * | 6/2007 | Lim et al. | 136/244 |
| 2011/0226312 A1 * | 9/2011 | Bohm et al. | 136/251 |
| 2012/0198780 A1 * | 8/2012 | Snowwhite | 52/173.3 |
| 2013/0112267 A1 * | 5/2013 | Wasson | 136/259 |

FOREIGN PATENT DOCUMENTS

| | | | |
|---|---|---|---|
| JP | H11240397 A | * | 7/1999 |
| JP | 11-321332 A | | 11/1999 |
| JP | 2012-033573 A | | 2/2012 |
| KR | 101255756 B1 | * | 4/2013 |

* cited by examiner

Fig.3
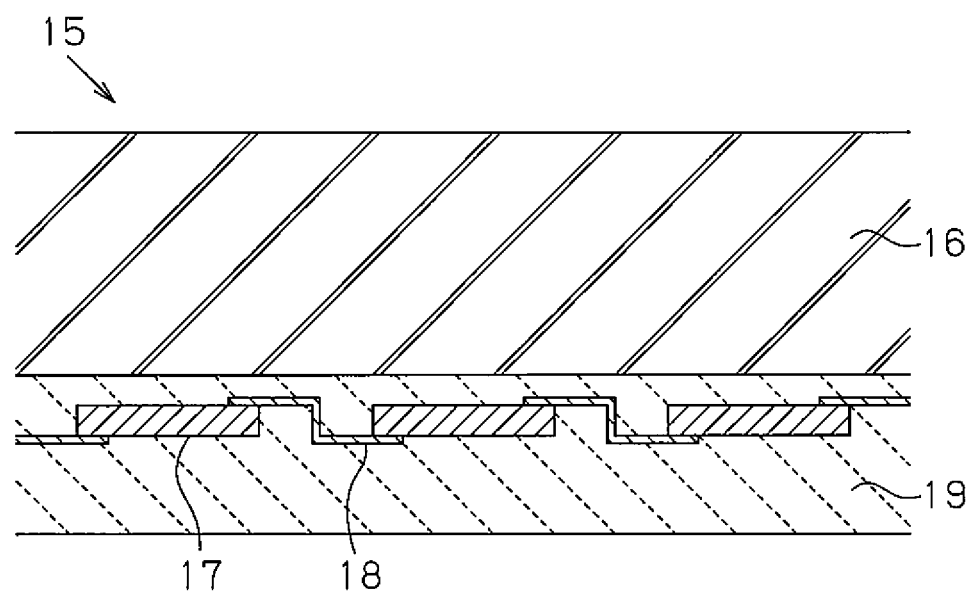
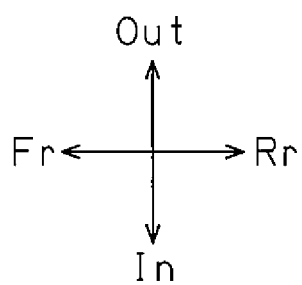

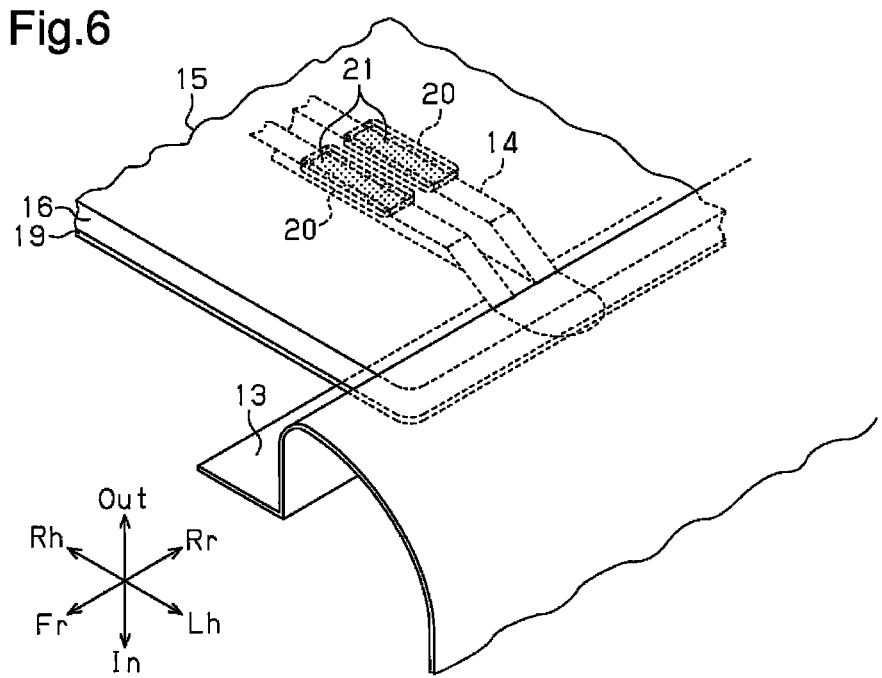
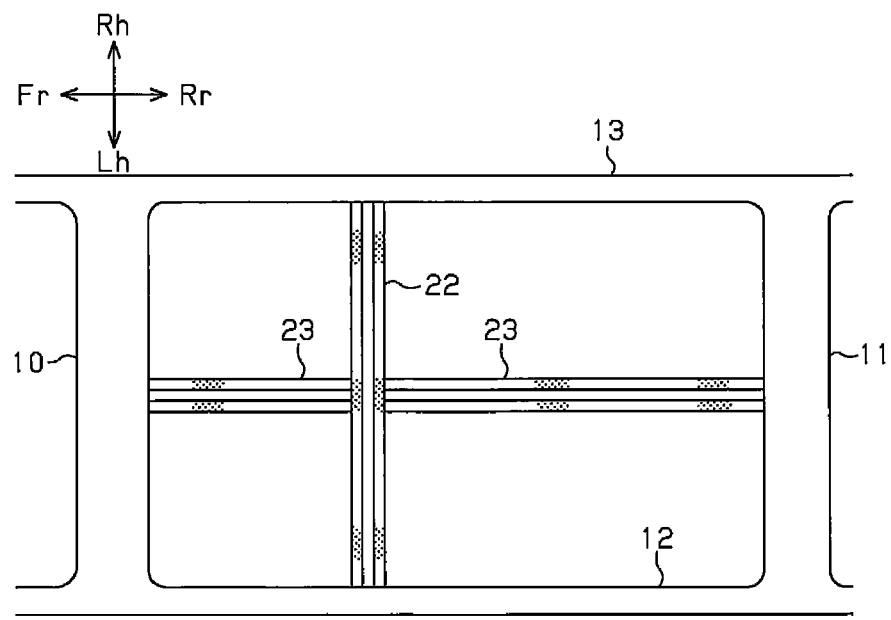

Fig.8A
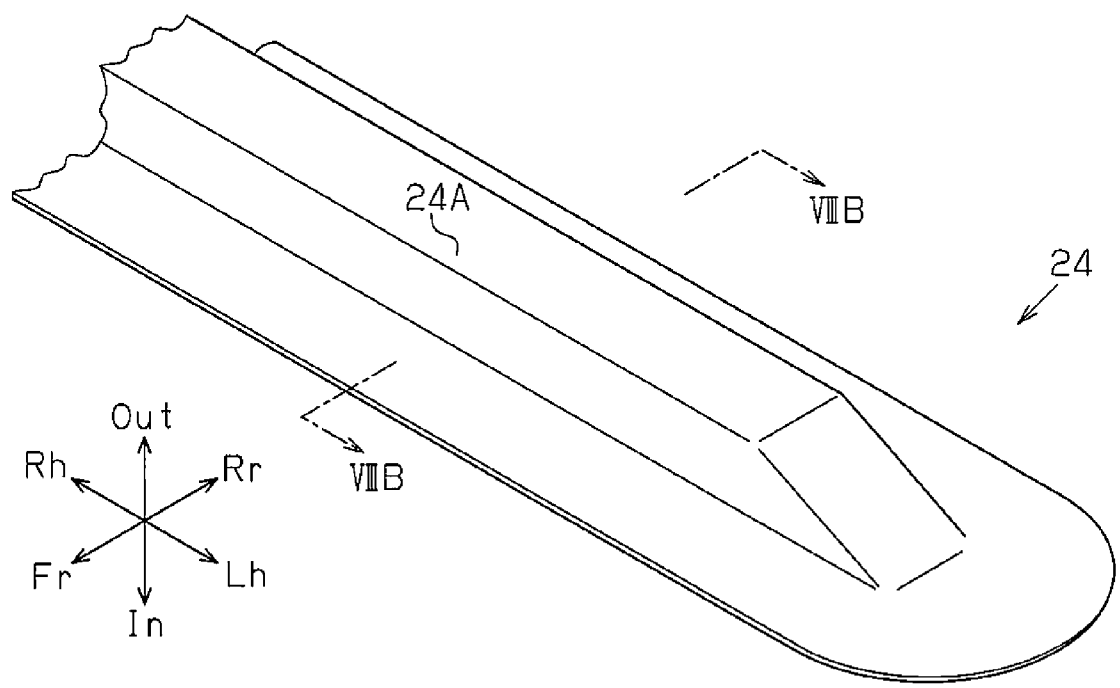
Fig.8B
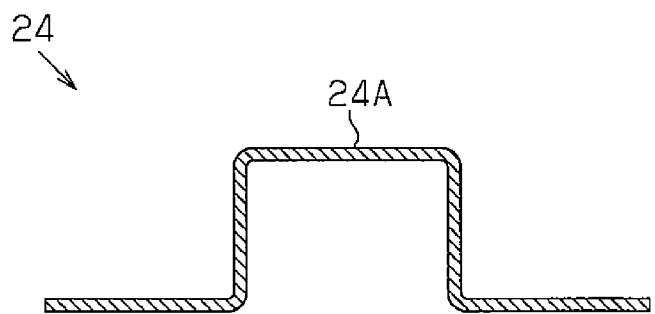
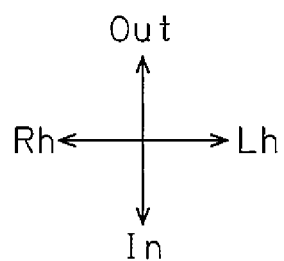

Fig.9A
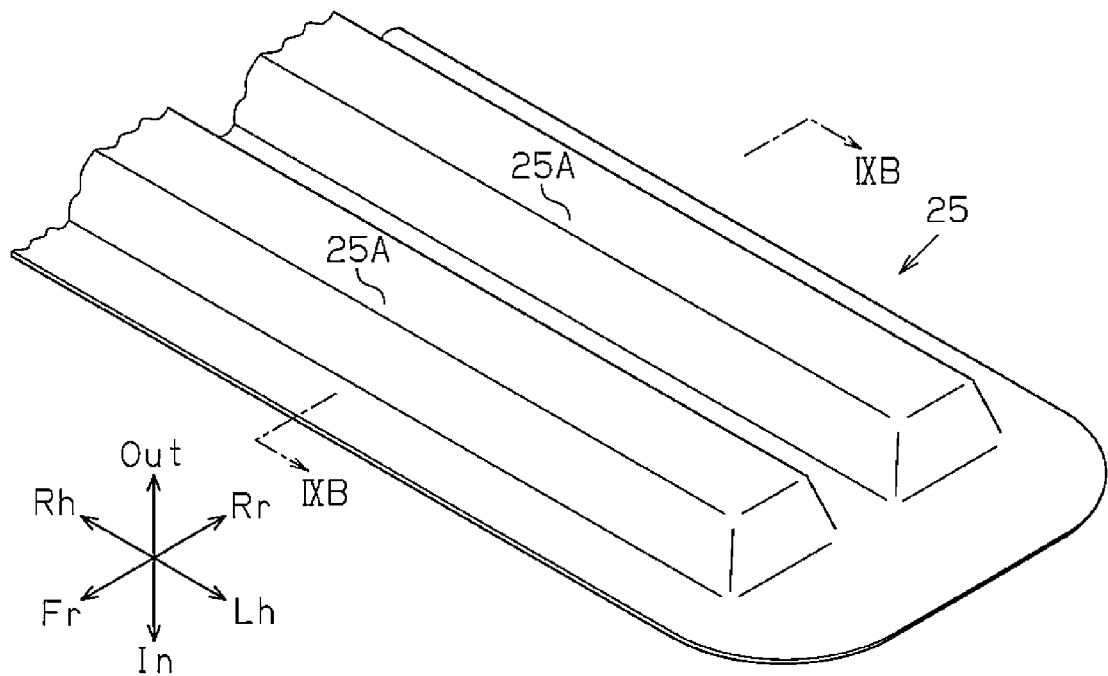
Fig.9B
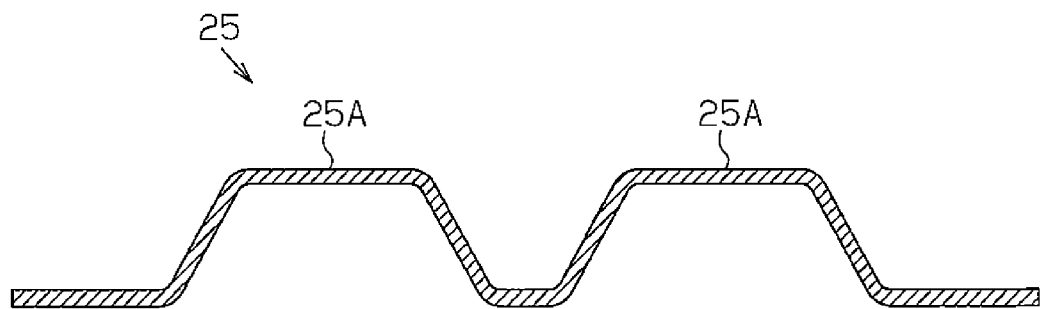
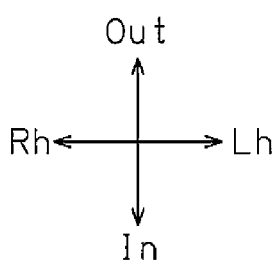

SOLAR BATTERY MOUNTING STRUCTURE FOR VEHICLE

CROSS-REFERENCE TO RELATED APPLICATIONS

The present application claims priority to Japanese Patent Application No. 2013-232483 filed on Nov. 8, 2013, which is incorporated herein by reference in its entirety.

BACKGROUND OF THE INVENTION

The present invention relates to a solar battery mounting structure for a vehicle for mounting a solar battery module on the roof of a vehicle body.

Japanese Laid-Open Patent Publication No. 62-085743 discloses a solar battery mounting structure for a vehicle for mounting a solar battery module on the roof of a vehicle body as illustrated in FIG. 12.

The mounting structure of FIG. 12 is employed in a vehicle that includes, as frame members, a front cross member 50 at the front edge of the roof, a rear cross member 51 at the rear edge of the roof, and a pair of roof side rails 52 at the left and right sides of the roof. A roof reinforcing member 54 is located at a portion between the front cross member 50 and the rear cross member 51 in the vehicle front-rear direction. The roof reinforcing member 54 extends in the widthwise direction of the vehicle and bridges the left and right roof side rails 52.

The roof of the vehicle is formed of a light transmitting panel, which is manufactured with glass or transparent plastic. The light transmitting panel 55 is fixed with adhesive to the roof side rails 52 from outside the passenger compartment. In contrast, the solar battery panel 56 is fixed with bolts 57 to the rear cross member 51 and the roof reinforcing member 54 from inside the passenger compartment.

In such a conventional solar battery mounting structure, the light transmitting panel 55 for protecting the solar battery panel 56 is fixed from outside the passenger compartment, while the solar battery panel 56 is fixed from inside the passenger compartment. Since the light transmitting panel 55 and the solar battery panel 56 are fixed separately, each requires a separate set of steps for installing.

Further, in such a conventional solar battery mounting structure, the arrangement of the solar battery panel 56 and the roof frame members is limited. That is, since the solar battery panel 56 is fixed from inside the passenger compartment, no roof reinforcing members can be arranged inside the region in which the solar battery panel 56 is located. Therefore, the position and the size of each of the solar battery panel 56 and the roof reinforcing member are restricted by the other. For example, if a solar battery panel that is large enough to cover the entire roof is mounted, no reinforcing members can be provided in the roof. As a result, the body structure cannot be easily shared between a vehicle type having a normal metal roof and a vehicle type having a solar battery mounting roof.

SUMMARY OF THE INVENTION

Accordingly, it is an objective of the present invention to provide a solar battery mounting structure for a vehicle that allows a solar battery to be easily installed on the roof of a vehicle body and can be easily replaced by a normal roof.

To achieve the foregoing objective and in accordance with one aspect of the present invention, a solar battery mounting structure for a vehicle is provided. The structure is used for mounting a solar battery module on a roof of a vehicle body. The solar battery module includes a glass panel and sealant located on a side of the glass panel that faces the inside of a passenger compartment of the vehicle. A solar battery cell is sealed in the sealant. A roof reinforcing member bridges over the roof of the vehicle body. The solar battery module includes a through portion that extends to the glass panel through the sealant. Adhesive is provided in the through portion. The adhesive bonds and fixes the glass panel to the roof reinforcing member.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 3 is a schematic cross-sectional view showing the solar battery module of FIG. 1;

FIG. 6 is a perspective view showing a part of the solar battery module and the vehicle body frame about through portions;

FIG. 7 is a plan view showing another arrangement of roof reinforcing members;

FIG. 8A is a partial perspective view showing a roof reinforcing member according to a modification;

FIG. 8B is a cross-sectional view taken along line XIIIB-XIIIB in FIG. 8A;

FIG. 9A is a partial perspective view showing a roof reinforcing member according to a further modification;

FIG. 9B is a cross-sectional view taken along line IXB-IXB in FIG. 9A;

DETAILED DESCRIPTION OF THE PREFERRED EMBODIMENTS

A solar battery mounting structure for a vehicle according to one embodiment of the present invention will now be described with reference to FIGS. 1 to 6. In each of the drawings, arrow Fr is directed to the front end of a vehicle body, arrow Rr is directed to the rear end of the vehicle body, arrow Lh is directed to the left side of the vehicle body, arrow Rh is directed to the right side of the vehicle body, arrow In is directed to the inside of the passenger compartment as viewed from the roof, and arrow Out is directed to the outside of the passenger compartment as viewed from the roof.

Figure 1:
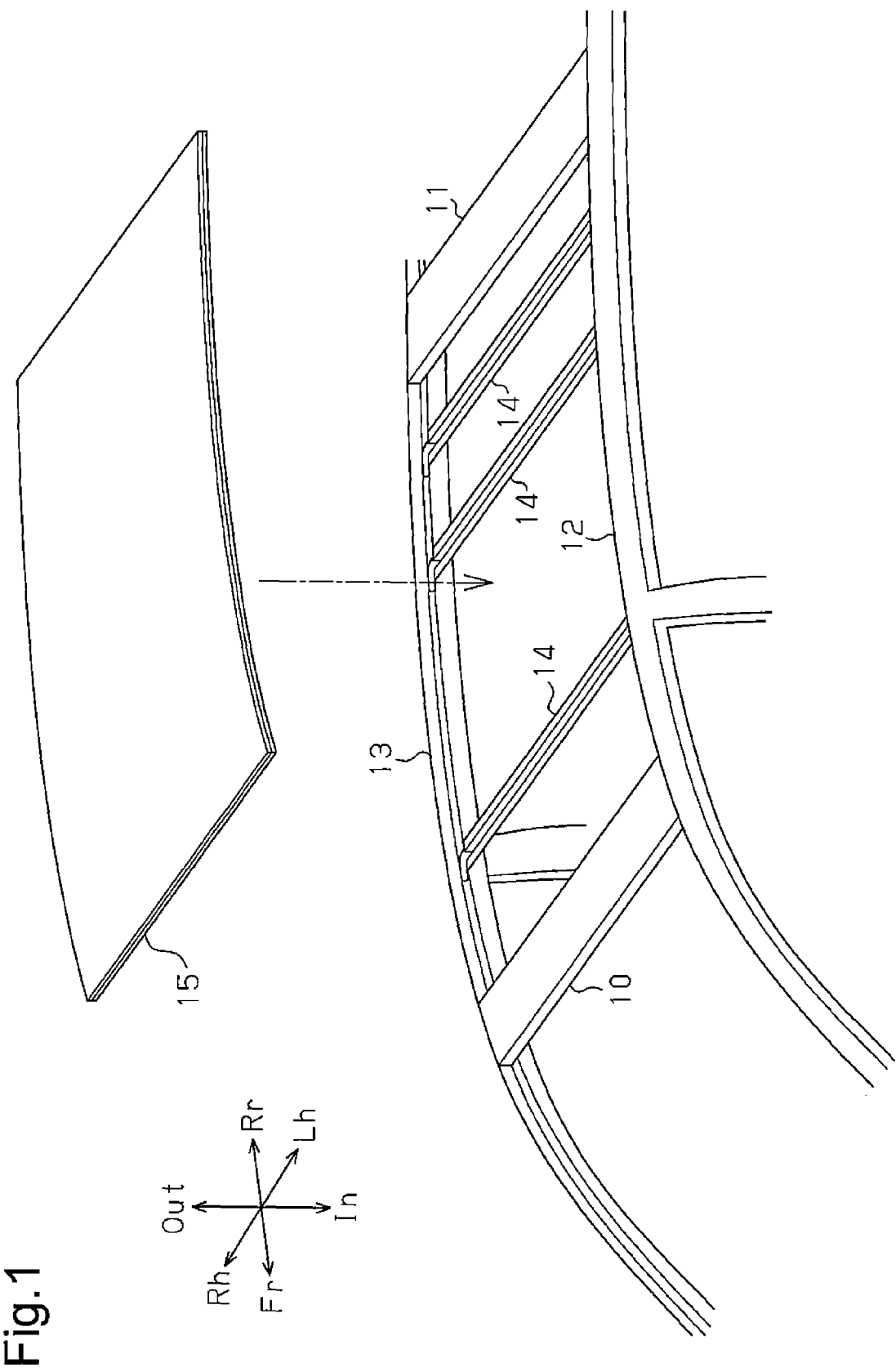
FIG. 1 is a perspective view showing the roof of a vehicle to which a solar battery mounting structure for a vehicle according to one embodiment is applied.

As shown in FIG. 1, the vehicle to which the solar battery mounting structure of the present embodiment is applied includes, as frame members of the roof, a front cross member 10 at the front edge of the roof, a rear cross member 11 at the rear edge of the roof, and a pair of roof side rails 12, 13 at the left and right sides of the roof. Further, roof reinforcing members 14 (the number of which is three in the example in the drawing) are located at portions between the front cross member 10 and the rear cross member 11. The roof reinforcing members 14 extend in the widthwise direction of the vehicle and bridge the left and right roof side rails 12, 13. The members 10 to 14, which form the frame of the roof, are formed by pressing metal plates. A solar battery module 15 is attached to the roof frame from above the vehicle body (from outside the passenger compartment).

Figure 2A:
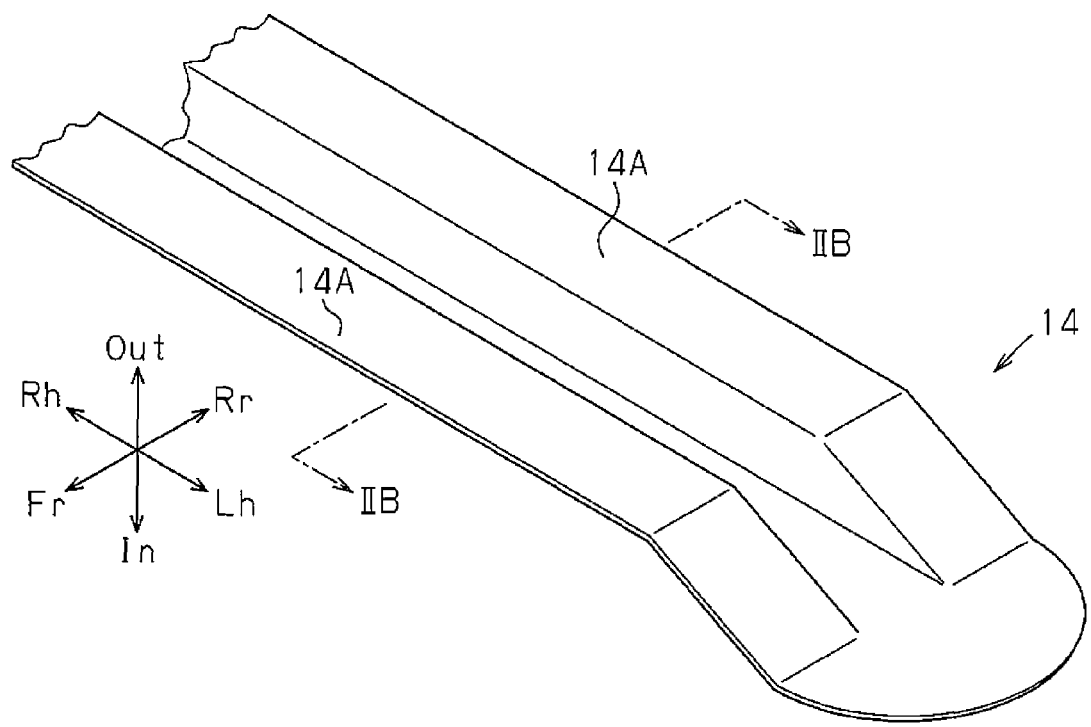
FIG. 2A is a partial perspective view showing a roof reinforcing member of the vehicle to which the embodiment of FIG. 1 is applied.
Figure 2B:
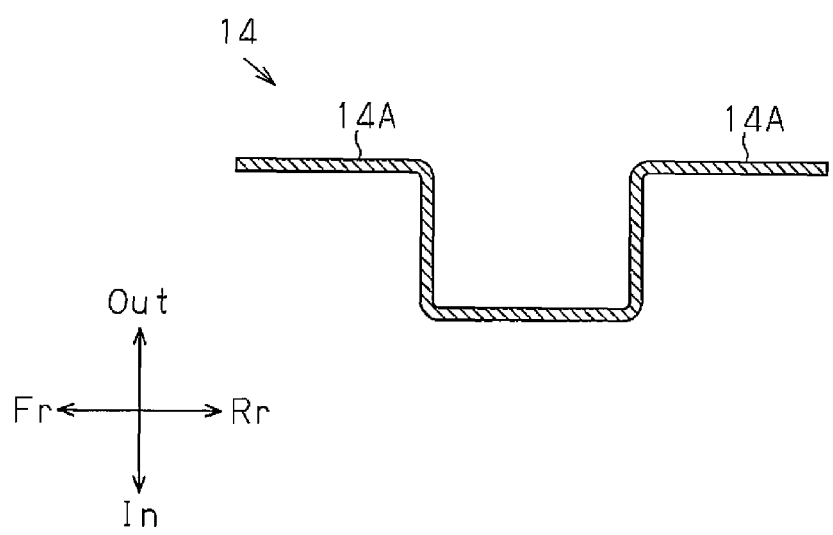
FIG. 2B is a cross-sectional view taken along line IIB-IIB in FIG. 2A.

FIG. 2A is a partial perspective view of a roof reinforcing member 14, and FIG. 2B is a cross-sectional view of the roof reinforcing member 14. As shown in FIGS. 2A and 2B, each roof reinforcing member 14 has a cross-sectional shape with a center portion in its widthwise direction, that is, in the front-rear direction of the vehicle body, recessed toward the inside of the passenger compartment. The flange-like portions on both sides in the widthwise direction serve as mounting surfaces 14A, on which the solar battery module 15 is placed when the module 15 is mounted from above the vehicle body.

As shown in FIG. 3, the solar battery module 15 includes a glass panel 16. Sealant 19 is integrated with the glass panel 16 on the side of the glass panel 16 facing the inside of the passenger compartment. The sealant 19 seals in it solar battery cells 17 and lines 18. For example, ethylene vinyl acetate copolymer resin or silicone is used as the sealant 19.

Figure 4:
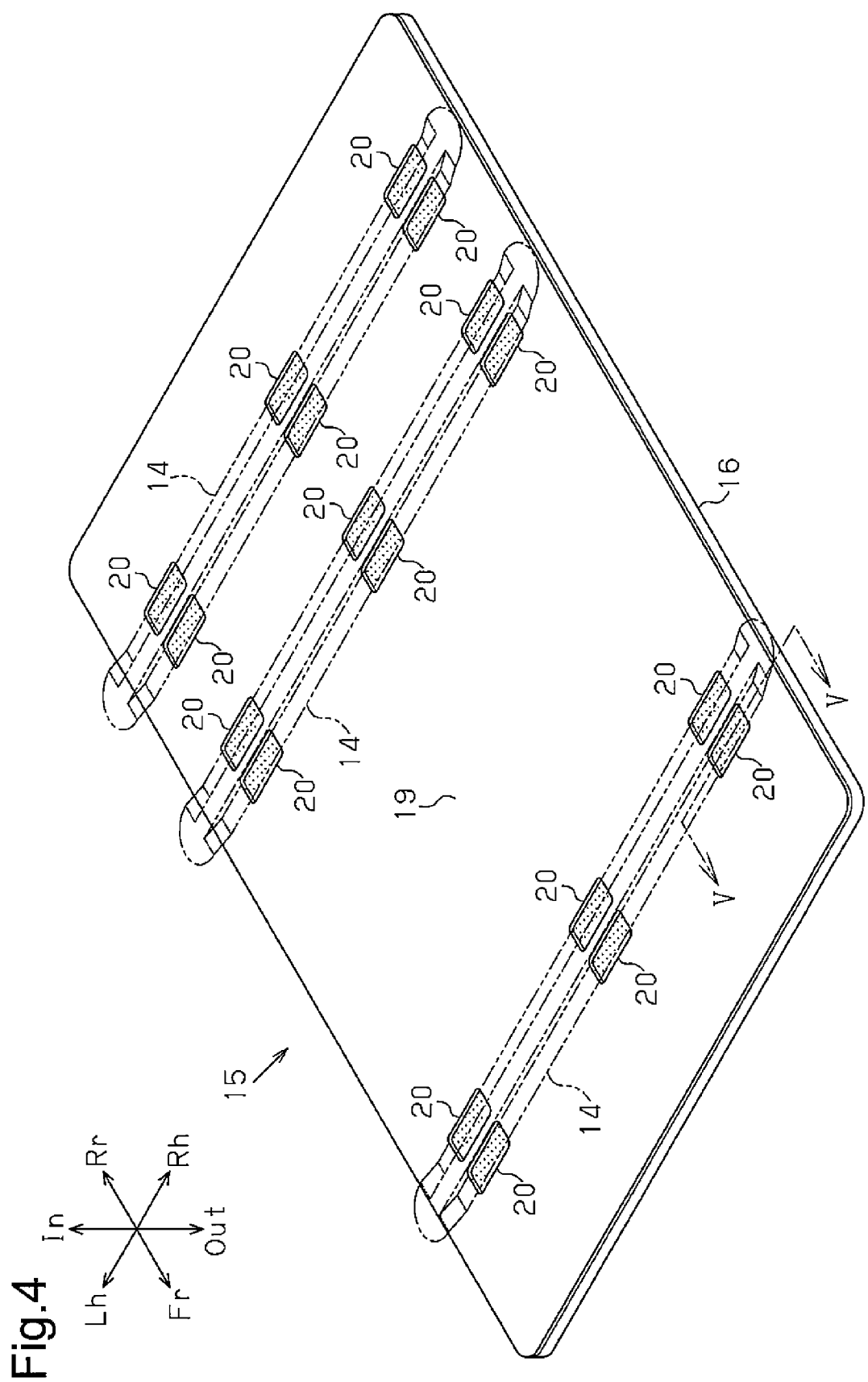
FIG. 4 is a perspective view showing the solar battery module as viewed from inside the passenger compartment.

As shown in FIG. 4, the solar battery module 15 has a rectangular-opening like through portions 20, which extend to the glass panel 16 from the surface facing the passenger compartment and though the sealant 19. A mounting surface 14A of a roof reinforcing member 14 is located directly below each through portion 20. In the present embodiment, each mounting surface 14A corresponds to three of the through portions 20 that are arranged at predetermined intervals in the vehicle widthwise direction.

Figure 5:
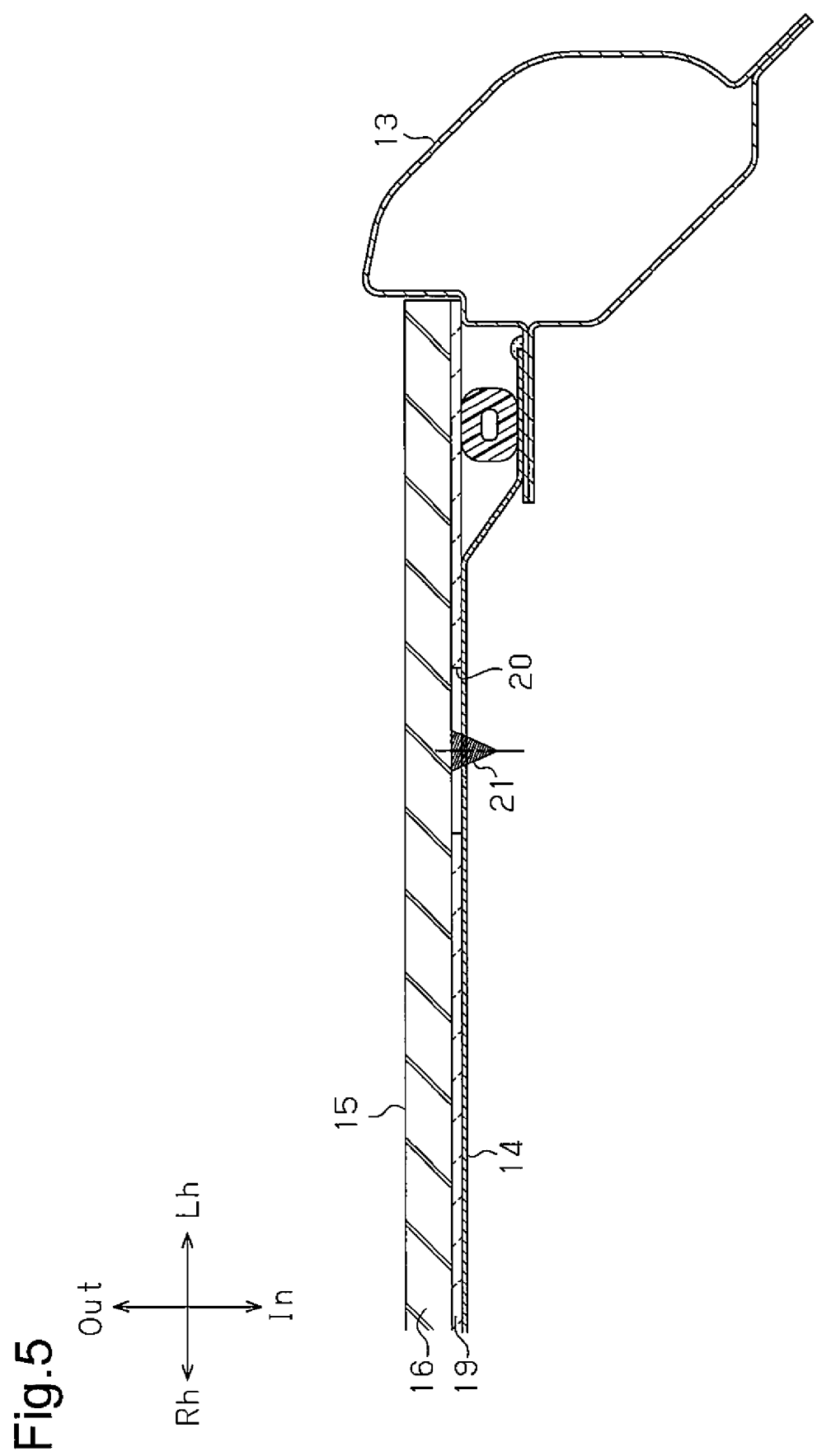
FIG. 5 is a cross-sectional view taken along line V-V of FIG. 4.

As shown in FIGS. 5 and 6, adhesive 21 is provided in each through portion 20. The adhesive 21 bonds the glass panel 16 to the roof reinforcing members 14. The adhesive for bonding the windshield and the rear window to the frame of the vehicle body is used as the adhesive 21.

According to the above described embodiment, the solar battery module 15 is mounted on a vehicle roof in the following manner. First, the adhesive 21 is applied to sections on the mounting surface 14A of each roof reinforcing member 14 that correspond to through portions 20 of the solar battery module 15. The solar battery module 15 is placed on the vehicle roof from above. This causes the adhesive 21 to be bonded, via the through portions 20, to the glass panel 16 and the mounting surfaces 14A, so that the solar battery module 15 is fixed to the vehicle roof.

The solar battery mounting structure for a vehicle according to the above described embodiment achieves the following advantages.

(1) The solar battery module 15 can be fixed to the vehicle roof simply by applying the adhesive 21 to the roof reinforcing members 14 and placing the solar battery module 15 on the vehicle body from above. Since the solar battery module 15 can be mounted on the vehicle by pressing the adhesive 21, the solar battery is easily installed on the vehicle roof.

(2) The position of the solar battery module 15 is not restricted by the arrangement of the roof reinforcing members 14, and thus no special structure is required for installing the solar battery module 15. Therefore, the body structure can be easily shared between a vehicle type having a normal metal roof and a vehicle type having a solar battery mounting roof.

(3) The position of the solar battery module 15 is not restricted by the arrangement of the roof reinforcing members 14. Therefore, a sufficient area of the solar battery can be easily ensured.

(4) Adhesion can be performed at any positions on the mounting surfaces 14A of the roof reinforcing members 14. Therefore, a sufficient bonding strength can be easily ensured.

(5) The solar battery module 15, which is formed by integrating the solar battery cells 17 and other members with the glass panel 16, is installed as a unit. This reduces the number of components that are to be installed in the vehicle body, and thus the number of installing steps is reduced.

(6) Since the adhesive for bonding the windshield and the rear window can be used as the adhesive 21, reliability is easily ensured.

The above embodiment may be modified as follows.

The number and positions of the roof reinforcing members 14 may be changed as necessary. For example, FIG. 7 shows a vehicle having a roof reinforcing member 23, which extends in the front-rear direction of the vehicle body, in addition to a roof reinforcing member 22, which extends in the widthwise direction of the vehicle body. The solar battery mounting structure of the above illustrated embodiment can be applied to the vehicle of FIG. 7. In FIG. 7, the dotted sections represent examples of parts to which the adhesive 21 is applied.

The shape of the roof reinforcing members may be freely changed as long as the members have mounting surfaces, on which the solar battery module 15 is mounted. For example, a roof reinforcing member 24 shown in FIGS. 8A and 8B has a hat-like cross-sectional shape. The top surface of the protrusion of the roof reinforcing member 24 is used as a mounting surface 24A, on which the solar battery module 15 is placed, and the adhesive 21 is applied to a part of the mounting surface 24A. Accordingly, a similar structure as the solar battery mounting structure of the above described embodiment can be employed. A roof reinforcing member 25 shown in FIGS. 9A and 9B have two protrusions 25A, which protrude toward the outside of the vehicle and extend in the widthwise direction of the vehicle body. The top surfaces of the protrusions of the roof reinforcing members 25 are used as mounting surfaces, on which the solar battery module 15 is placed, and the adhesive 21 is applied to parts of the mounting surfaces. Accordingly, a similar structure as the above described embodiment can be employed.

Figure 10:
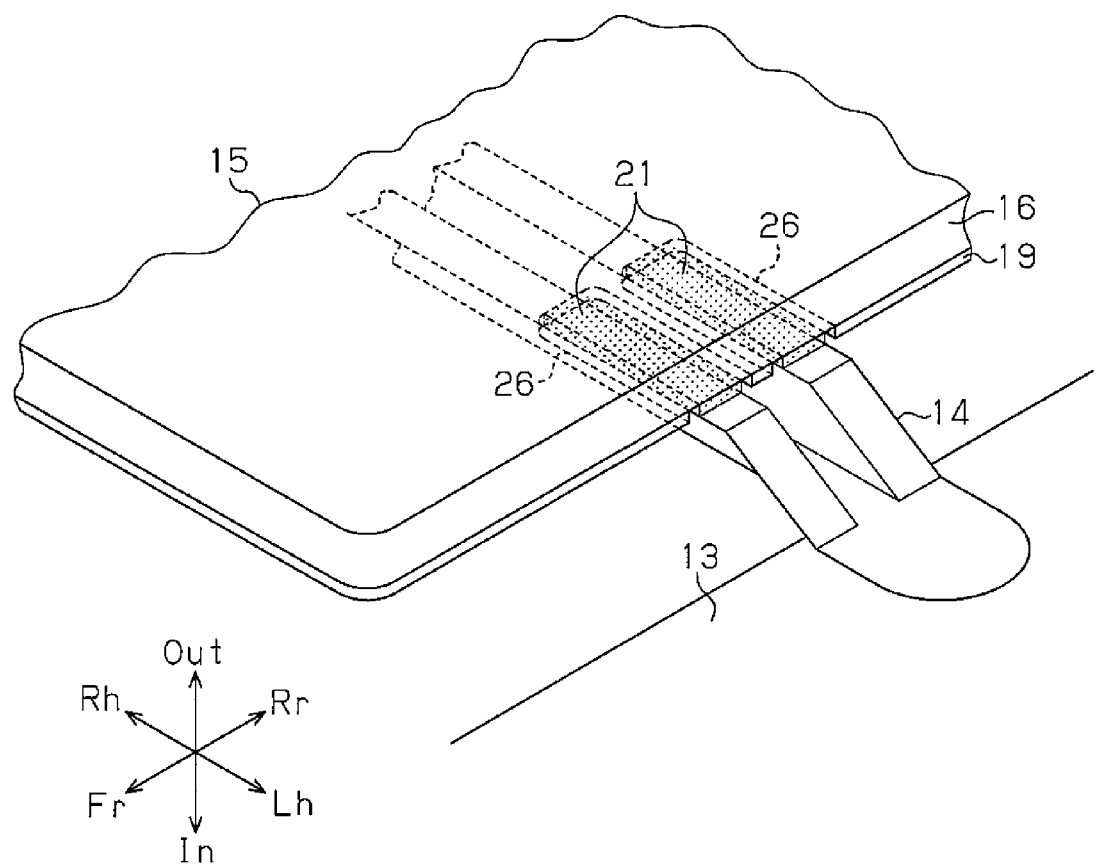
FIG. 10 is a partial perspective view showing a solar battery module and a vehicle body frame in a case in which adhesion is performed at positions close to a side of a solar battery panel.
Figure 11:
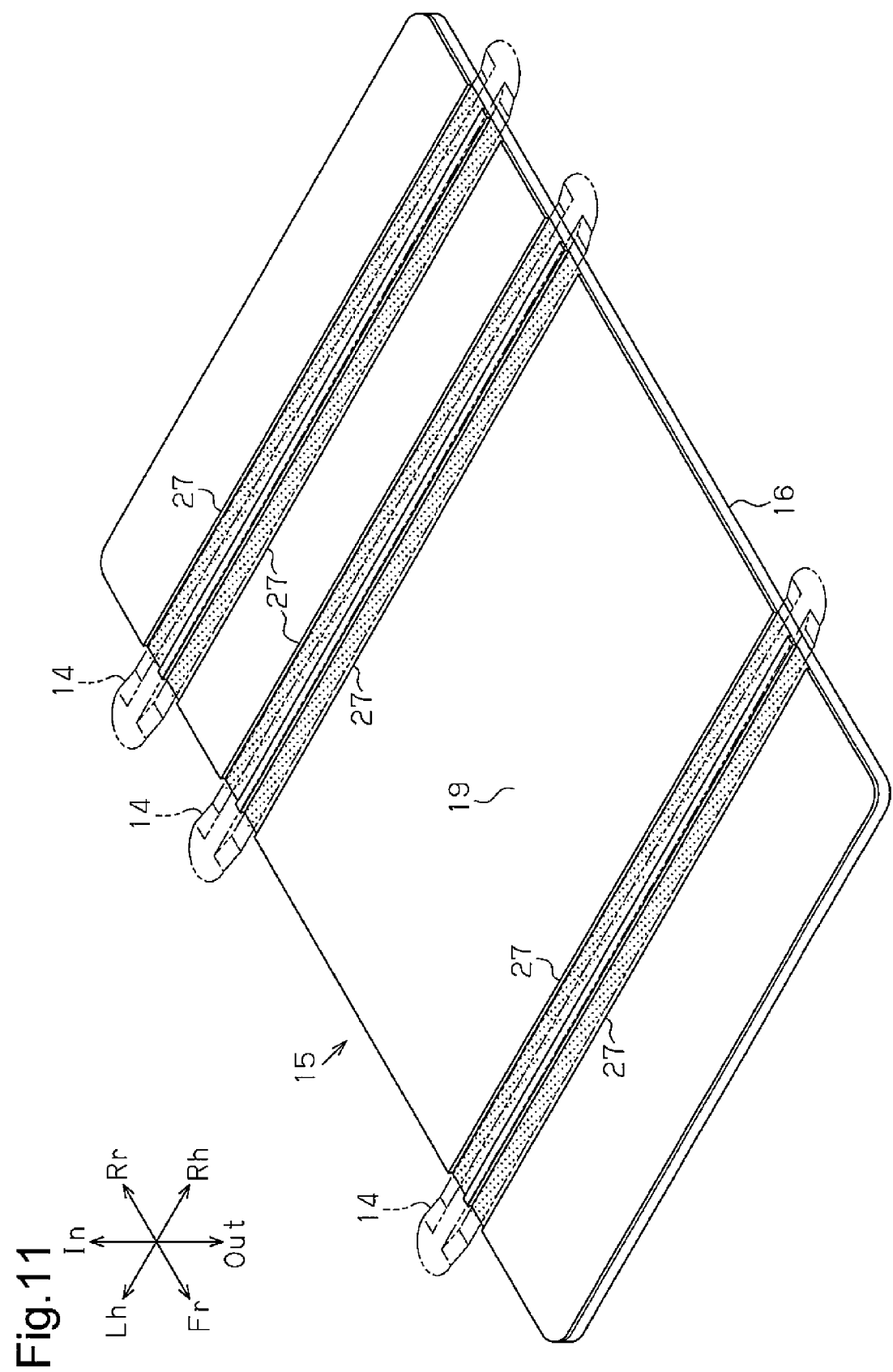
FIG. 11 is a perspective view of a solar battery panel as viewed from inside the vehicle, illustrating a case in which adhesion is performed over the entire mounting surfaces.
Figure 12:
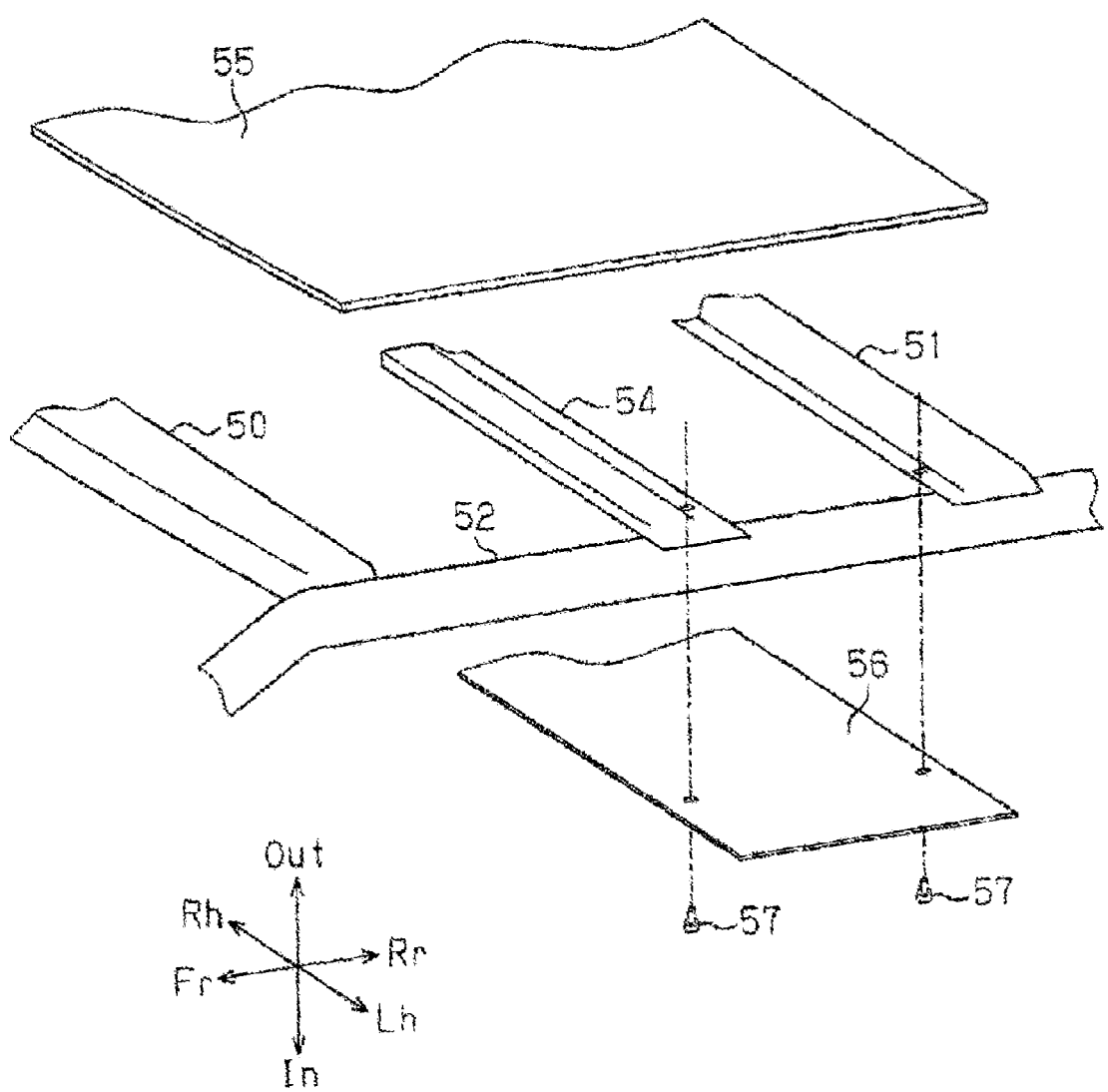
FIG. 12 is an exploded perspective view showing a conventional solar battery mounting structure for a vehicle.

As long as the required bonding strength is ensured, the position, the number, and the shape of the through portions 20 on the solar battery module 15 may be changed as necessary. For example, in a case in which adhesion at positions close to the side edge of the solar battery module 15 is desired, notch-shaped through portions 26 as illustrated in FIG. 10 may be provided. In case in which the area of adhesion is desired to be enlarged, the adhesive 21 can be applied to the entire mounting surface 14A. In such a case, belt like through portions 27, which extend in the widthwise direction of the vehicle body, are formed in the solar battery module 15 as shown in FIG. 11.

The shape and the size of the solar battery module 15 may be changed as necessary. For example, only a part of the roof may be formed of a solar battery module, and the remaining part of the roof may be formed of a metal roof. Even in such a case, as long as roof reinforcing members are located directly below the parts where the solar battery module is located, a similar mounting structure as the above described embodiment can be employed.

The invention claimed is:

1. A solar battery mounting structure for a vehicle for mounting a solar battery module on a roof of a vehicle body, wherein
the solar battery module includes a glass panel and sealant located on a side of the glass panel that faces the inside of a passenger compartment of the vehicle,
a solar battery cell is sealed in the sealant,
a roof reinforcing member bridges over the roof of the vehicle body,
the solar battery module includes a through portion that extends through the sealant and stops at the glass panel,
adhesive is provided in the through portion and the adhesive stops at the glass panel, and
the adhesive bonds and fixes the glass panel to the roof reinforcing member.

* * * * *